United States Patent [19]

Shimizu et al.

[11] Patent Number: 5,258,321
[45] Date of Patent: Nov. 2, 1993

[54] MANUFACTURING METHOD FOR SEMICONDUCTOR MEMORY DEVICE HAVING STACKED TRENCH CAPACITORS AND IMPROVED INTERCELL ISOLATION

[75] Inventors: Masahiro Shimizu; Katsuhiro Tsukamoto; Masahide Inuishi, all of Hyogo, Japan

[73] Assignee: Mitsubishi Denki Kabushiki Kaisha, Tokyo, Japan

[21] Appl. No.: 896,872

[22] Filed: Jun. 10, 1992

Related U.S. Application Data

[60] Division of Ser. No. 763,483, Sep. 23, 1991, abandoned, which is a continuation of Ser. No. 572,322, Aug. 22, 1990, abandoned, which is a continuation of Ser. No. 269,766, Nov. 10, 1988, abandoned.

[30] Foreign Application Priority Data

Jan. 14, 1988 [JP] Japan .................................. 63-7313

[51] Int. Cl.⁵ .................................. H01L 21/70
[52] U.S. Cl. .................................. 437/52; 437/47; 437/60; 437/69; 437/919
[58] Field of Search ............... 357/23.6, 23.5, 23.4, 357/55; 437/47, 52, 48, 60, 203, 919, 69; 257/303, 304, 305

[56] References Cited

U.S. PATENT DOCUMENTS

| | | | |
|---|---|---|---|
| 4,577,395 | 3/1986 | Shibata | 29/576 |
| 4,855,952 | 8/1989 | Kiyosumi | 365/149 |
| 4,855,953 | 8/1989 | Tsakamoto et al. | 365/149 |
| 4,921,816 | 5/1990 | Imo | 437/52 |

FOREIGN PATENT DOCUMENTS

| | | | |
|---|---|---|---|
| 0187596 | 7/1986 | European Pat. Off. | 357/23.6 |
| 172931 | 9/1983 | Japan . | |
| 56266 | 12/1983 | Japan . | |
| 60-136367 | 7/1985 | Japan | 357/23.6 |
| 55258 | 11/1986 | Japan . | |
| 61-287258 | 12/1986 | Japan | 357/23.6 |

OTHER PUBLICATIONS

IEEE Transactions on Electron Devices: "A Corrugated Capacitor Cell (CCC)", By H. Sunami et al, vol. ED-31, No. 6 Jun. 1984, pp. 746-753.

Primary Examiner—Tom Thomas
Attorney, Agent, or Firm—Lowe, Price, LeBlanc & Becker

[57] ABSTRACT

A semiconductor memory device having memory cells formed adjacent to each other comprises a P type semiconductor substrate having adjacent two trenches, a P+ impurity region formed in the side portions and the bottom portions of the trenches, n type first polysilicon layers serving as common electrodes formed in the upper portion of the P+ impurity region through an insulating film, second polysilicon layers formed inside and in the upper portion of the trenches formed of the first polysilicon layers through an insulating film, and a third polysilicon layer formed on the second polysilicon layers, only the third polysilicon layer constituting a connecting electrode between the adjacent memory cells.

11 Claims, 12 Drawing Sheets

7: BIT LINE      9: CAPACITOR
8: TRANSISTOR    10: WORD LINE

FIG.4C
FIG.6C
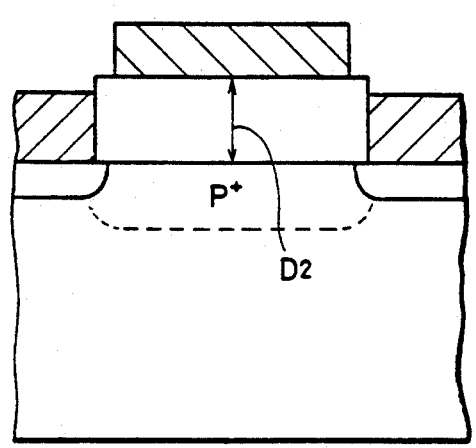
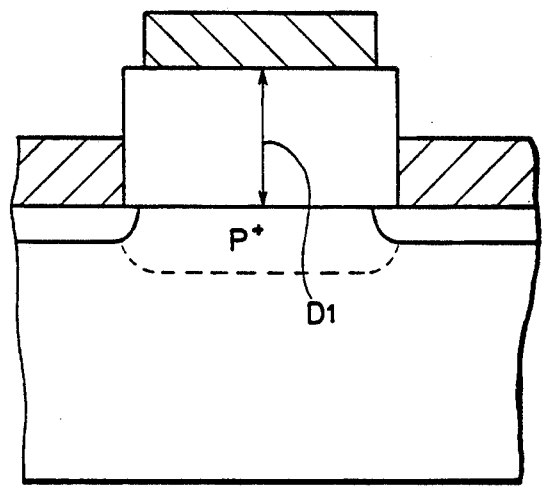
FIG.6D
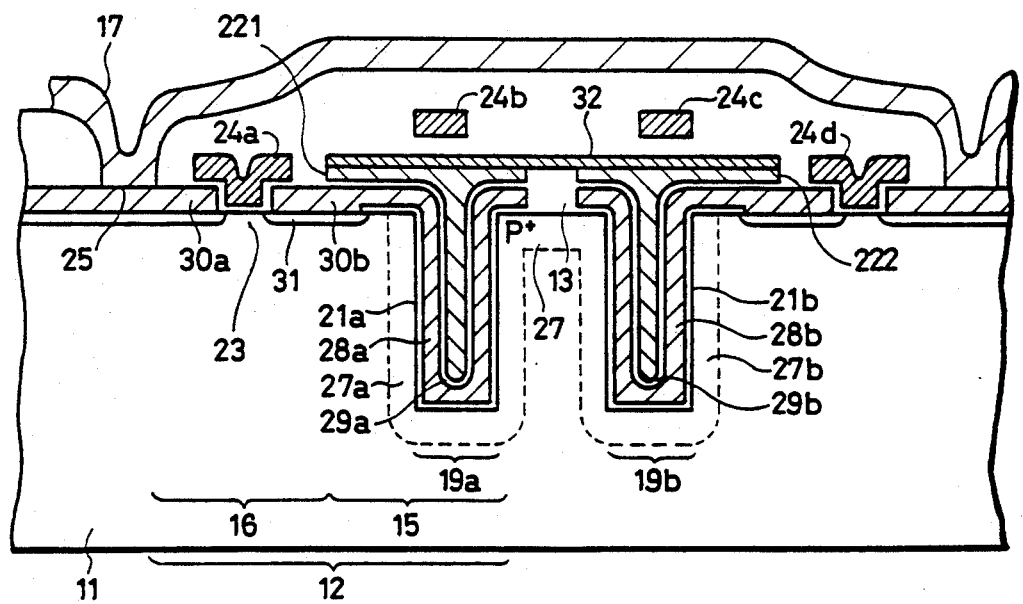

MANUFACTURING METHOD FOR SEMICONDUCTOR MEMORY DEVICE HAVING STACKED TRENCH CAPACITORS AND IMPROVED INTERCELL ISOLATION

This application is a divisional of abandoned application Ser. No. 07/763,483, filed Sep. 23, 1991 which is a continuation of abandoned application Ser. No. 07/572,322, filed Aug. 22, 1990, which is a continuation of abandoned Ser. No. 07/269,766, filed Nov. 10, 1988.

CROSS-REFERENCE TO RELATED, COPENDING APPLICATION

A related, copending application of particular interest to the instant application is U.S. Ser. No. 158,323, entitled "Semiconductor Memory Device Having Stacked Memory Capacitors and Method for Manufacturing the Same", filed and assigned to the same assignee of the instant application.

BACKGROUND OF THE INVENTION

1. Field of the Invention

The present invention relates generally to semiconductor memory devices and more particularly to trench type memory devices having improved isolation between adjacent memory cells and a manufacturing method therefor.

2. Description of the Prior Art

Recently, significant progress has been made in a semiconductor memory device. For example, in a random access memory (RAM), various attempts to provide high integration density have been made without decreasing storage characteristics thereof.

FIG. 1 is a block diagram showing an example of structure of a general RAM. Referring to FIG. 1, a plurality of word lines and a plurality of bit lines are arranged to intersect with each other in a memory cell array, a memory cell (not shown) being provided at each of intersections of the word lines and the bit lines. A particular memory cell is selected based on an intersection of a single word line selected by an X address buffer decoder and a single bit line selected by a Y address buffer decoder. Data is written to the selected memory cell or data stored in the memory cell is read out. Write/read operation of the data is specified by a read/write control signal (R/W) applied to an R/W control circuit. At the time of writing data, input data (Din) is inputted to the selected memory cell through the R/W control circuit. On the other hand, at the time of reading out data, the data stored in the selected memory cell is detected and amplified by a sense amplifier and outputted to the exterior through a data output buffer as output data (Dout).

FIG. 2 is an equivalent circuit diagram of a dynamic memory cell shown for explaining write/read operation of a memory cell.

Referring to FIG. 2, each dynamic memory cell comprises a single field effect transistor 8 and a single capacitor 9. The field effect transistor 8 has one conduction terminal connected to one of the electrodes of the capacitor 9 and another conduction terminal connected to a bit line 7. In addition, the transistor 8 has a gate electrode connected to a word line 10. The capacitor 9 has another electrode connected to ground. At the time of writing data, since a predetermined potential is applied to the word line 10 so that the field effect transistor 8 is rendered conductive, charge from the bit line 7 is stored in the capacitor 9. On the other hand, at the time of reading out data, since a predetermined potential is applied to the word line 10 so that the field effect transistor 8 is rendered conductive, charge stored in the capacitor 9 is obtained through the bit line 7. As obvious from the foregoing, storage capacity of a memory cell is based on the capacitance of its capacitor 9. Thus, in order to provide high integration density of a memory cell array, various attempts to maintain and increase capacitance of each memory capacitor have been made. Such attempts are disclosed in, for example, Japanese Patent Publication Nos. 56266/1983 and 55258/1986 and Japanese Patent Laying-Open Gazette No. 65559/1985. As one kind of such attempts, a trench memory cell has been developed in which a trench is formed in a semiconductor substrate and a charge storage region is formed in the inner surface of the trench so that storage capacity can be maintained or increased.

FIG. 3A is a plan view of a dynamic RAM using such a trench memory cell, and FIG. 3B is a cross sectional view taken along a line B—B shown in FIG. 3A. The trench memory cell is disclosed in, for example, an article by H. Sunami et al., entitled "A Corrugated Capacitor Cell", IEEE Trans. Electron Devices, Vol. ED-31, pp. 746-753.

Referring to FIGS. 3A and 3B, a plurality of memory cells 12 are formed on the surface of a P type silicon substrate 11. In FIG. 3A, each of the memory cells 12 corresponds to a section formed by a dot and dash line. The adjacent memory cells 12 are isolated by an isolation field oxide film 13. A channel stop p+ region 14 for isolation is formed under the field oxide film 13. Each of the memory cells 12 comprises a charge storage region 15 for storing charges, an access transistor region 16 and an N+ region 18 connected to a bit line 17. More specifically, the charge storage region 15 comprises a trench 19 formed in the major surface of the P type silicon substrate 11, an N+ region 20 formed in a part of the major surface of the P type silicon substrate 11 including the inner surface of the trench 19 and serving as a memory terminal of a memory capacitor, a capacitor dielectric film 21 formed to cover the inner surface of the trench 19, and a cell plate electrode 22 formed on the capacitor dielectric film 21 and serving as an opposite electrode of the memory capacitor. In addition, the access transistor region 16 comprises N+ regions 18 and 20, a channel region 23 formed therebetween, and a word line 24 constituting a gate electrode. The bit line 17 is connected to the N+ region 18 through a contact hole 25.

Referring now to FIG. 3B, description is made on write/read operation of data stored in the memory cell 12. At the time of writing data, since a predetermined potential is applied to the word line 24 so that an inversion layer is formed in the channel region 23, the N+ regions 18 and 20 are rendered conductive. Thus, charges from the bit line 17 are transferred to the charge storage region 15 through the channel region 23 and stored in the N+ region 20. On the other hand, at the time of reading out data, a predetermined potential is applied to the word line 24 so that the charges stored in the N+ region 20 are provided to the exterior through the inverted channel region 23, the N+ region 18 and the bit line 17.

The amount of charges thus stored depends on the area of the N+ region 20 formed in the inner surface of the trench 19, so that formation of the trench 19 can contribute to formation of large charge storage capacitance while preventing increase of the planar area occupied by the charge storage region 15. More specifically, the trench 19 is formed and a trench capacitor utilizing the trench 19 is used, so that a memory capacitor having relatively large capacitance can be ensured while maintaining the area occupied by very fine memory cells.

However, the dynamic RAM shown in FIGS. 3A and 3B presents the following problems with respect to high integration density.

More specifically, in the conventional dynamic RAM, the P type silicon substrate 11 is set to a negative potential (about $-3V$). In addition, a potential of about 5V or about 0V is applied to the N+ regions 20 (20a, 20b) each serving as a charge storage region in response to memory information "1" or "0". Thus, a reverse bias voltage is usually applied between the N+ regions 20a and the memory information. As a result, depletion regions irrespective of 26a and 26b are formed around the N+ regions 20a and 20b. The higher the reverse bias voltage is or the lower the impurity concentration of the P type silicon substrate 11 is, the more easily the depletion regions 26a and 26b expand. Since the impurity concentration of the P type silicon substrate 11 is generally decreased with distance from the major surface, the depletion layers 26a and 26b as represented by a dotted line in FIG. 3B expand. As a result, when it is desired to form the trenches 19a and 19b deep to increase storage capacity, the distance (the distance a represented by an arrow in FIG. 3B) between the adjacent depletion regions 26a and 26b is further reduced. In addition, it is obvious that the distance is also reduced if the positions where the trenches 19a and 19b are formed are close to each other for high integration density. Thus, when the adjacent trenches 19a and 19b are close to each other and the trenches 19a and 19b are formed deeper for higher integration density, a punch-through phenomenon finally occurs in which the depletion regions 26a and 26b come in contact with each other ($a=0$). When such a punch-through phenomenon occurs, conduction between adjacent memory cells occurs, so that charges stored in the N+ regions 20a and 20b interfere with each other due to the difference in memory information stored in the adjacent memory cells. As a result, information holding characteristics are decreased. More specifically, it becomes difficult to decrease the spacing between the adjacent trenches 19a and 19b and form the trenches deeper, which presents a large difficulty in providing high integration density of memory cells.

Additionally, in the dynamic RAM shown in FIGS. 3A and 3B, a memory terminal of the memory capacitor comprises the N+ region 20 in the P type silicon substrate 11. Thus, carriers produced upon incidence of radioactive rays, such as alpha rays, into the silicon substrate flow into the N+ region 20 serving as a memory terminal of the memory capacitor, so that a malfunction (referred to as soft errors hereinafter) occurs in which the original memory information is inverted.

DISCUSSION OF THE COPENDING APPLICATION

In order to solve the conventional problems, a semiconductor memory device having the following structure is considered.

FIG. 4A is a plan view of a dynamic RAM showing an example of the semiconductor memory device, and FIG. 4B is a cross sectional view taken along a line IVB—IVB shown in FIG. 4A.

Referring to FIGS. 4A and 4B, a plurality of memory cells 12 are formed on a P type silicon substrate 11. Each of the memory cells 12 corresponds to a section formed by a dash and dot line. The adjacent memory cells 12 are isolated by an isolation field oxide film 13. Each of the memory cells 12 comprises a charge storage region 15 for storing charges, an access transistor region 16 and an N+ region 18 connected to a bit line 17. More specifically, the charge storage region 15 in the memory cell 12 shown in FIG. 4B comprises a trench 19 formed in the major surface of the P type silicon substrate 11, a P+ regions 27 formed in the substrate 11 on the side of the bottom surface and side surface of the trench 19 and serving as an opposite electrode, a first capacitor insulating film 21 formed by, for example, oxidizing the surface of the P+ regions 27, a first polysilicon (polyerystalline silicon) electrode 28 formed on the first capacitor insulating film 21 and serving as a memory terminal of a memory capacitor, a second capacitor insulating film 29 formed on the first polysilicon electrode 28 by, for example, oxidizing the surface of the first polysilicon electrode 28, and a second polysilicon electrode 22 formed on the second capacitor insulating film 29 and serving as a cell plate electrode. An N+ region 31 corresponding to a drain of the access transistor 16 is connected to the first polysilicon electrode 28 through a contact hole 33. In addition, the adjacent memory cells 12 are isolated by the isolation field oxide film 13.

More specifically, in the memory cell shown in FIG. 4B, the P+ region 27 and the first polysilicon electrode 28 which are opposed to each other with the first capacitor insulating film 21 interposed therebetween constitute a first memory capacitor MC1, and the first polysilicon electrode 28 and the second polysilicon electrode 22 which are opposed to each other with the second capacitor insulating film 29 interposed therebetween constitute a second memory capacitor MC2. Thus, the memory cell shown in FIG. 4B has structure in which the second memory capacitor MC2 is stacked on the first memory capacitor MC1 with the first polysilicon electrode 28 which is a common electrode layer interposed therebetween.

Referring now to FIG. 4B, description is made on write/read operation of data stored in the memory cell 12. At the time of writing data, when a predetermined potential is applied to the word line 24, an inversion layer is formed in a channel region 23, so that the N+ regions 18 and 31 are rendered conductive. Thus, charges from the bit line 17 are transferred to the charge storage region 15 through the channel region 23 and stored in the first polysilicon electrode 28 which is a common electrode layer serving as a memory terminal through the N+ region 31 and a contact hole 25. On the other hand, at the time of reading out data, the charges stored in the first polysilicon electrode 28 are provided to the exterior through the channel region 23 inverted by application of a predetermined potential to the word line 24, the N+ region 18 and the bit line 17.

Thus, according to the embodiment shown in FIG. 4B, the trench structure and the double stacked structure of memory capacitors are combined, so that larger capacitance of the memory capacitors can be ensured while maintaining the small area occupied by memory cells. In addition, punch-through and soft errors never occur.

Description is now made on a method for manufacturing the memory cell shown in FIG. 4B. FIGS. 5A to 5H are cross sectional views for explaining process steps of a method for manufacturing the memory cell 12 shown in FIG. 4B.

Referring now to FIG. 5A, a resist pattern 35 having an opening for defining a desired trench region is formed on the surface of a P type silicon substrate 11. The silicon substrate 11 is etched through the opening defined by the resist pattern so that a trench 19 having a predetermined depth is formed. Thereafter, P type impurities such as boron are doped into the side surface and the bottom surface in the trench so that a P+ region 27 is formed.

Referring next to FIG. 5B, the surface of the P type silicon substrate 11 is oxidized so that a first capacitor dielectric film 21 is formed.

In FIG. 5C, a first polysilicon electrode pattern 28 is formed on the P type silicon substrate 11, and N type impurities are doped into the first polysilicon electrode.

Then, in FIG. 5D, boron is implanted into a region between the first polysilicon electrode patterns in the adjacent memory cells so that an impurity doped region 14 is formed.

The impurity doped region 14 including the trench is covered with a silicon oxide film 13. Thereafter, the silicon oxide film 13 is etched from the top thereof until an oxide film of an isolation region is formed. Then, the oxide film embedded into the trench is removed. A second capacitor insulating film 29 is formed by, for example, oxidizing the surface of the first polysilicon electrode 28 and then, a second polysilicon electrode pattern 22 is formed on the second capacitor insulating film 29 as a cell plate (in FIG. 5E).

Referring next to FIG. 5F, a polysilicon layer in a portion corresponding to a channel region of an access transistor is removed.

In FIG. 5G, a gate oxide film is formed on the above described channel region, and an insulating film 35 is formed on the other region by high temperature oxidation. Thereafter, a word line 24 serving as a gate electrode is formed in a predetermined pattern, and an insulating layer is formed on the word line 24 by high temperature oxidation. In addition, a contact hole 25 is formed. During such heat treatment, a source region 18 and a drain region 31 of the access transistor are formed by diffusing impurities from polysilicon layers 30a and 30b.

Finally, in FIG. 5H, a bit line 17 is formed, so that a memory cell 12 is completed.

As described in the foregoing, according to the embodiment shown in FIG. 4B, since the first polysilicon electrode 28 is coupled to the N+ region 31 of the access transistor through a polysilicon layer 30 which is the same layer as the first polysilicon electrode 28, the first polysilicon electrode 28 and the N+ region 31 are connected without requiring a contact hole. Thus, a contact hole need not be formed in the first capacitor insulating film 21, so that it is not likely that the electrical reliability of the capacitor insulating film is decreased. Furthermore, according to the embodiment shown in FIG. 5B, occurrence of soft errors in a so-called bit line mode can be significantly controlled and the width of the intercell isolation region can be decreased to a minimum size determined by photolithographic techniques, so that still higher integration density can be provided.

Description was made on a semiconductor memory device in which integration density can be increased without decreasing operating characteristics. However, the parasitic capacitance is created at the insulation region between adjacent memory cells.

SUMMARY OF THE INVENTION

Accordingly, one object of the present invention is to improve intercell isolation in trench type memory arrays.

Another object of the present invention is to provide improved intercell isolation in memory cells having stacked trench type capacitors.

Further object of the present invention is to reduce the effect of a parasitic transistor formed between cells of trench type memory arrays.

Additional object of the present invention is to provide a method for manufacturing trench type memory cells having improved intercell isolation.

A semiconductor memory device according to the present invention is adapted such that adjacent memory cells are formed inside and in the upper portion of adjacent trenches formed in a semiconductor substrate, each of the memory cells comprises opposed capacitors, the capacitor on the upper side comprises two layers, and only the upper layer thereof constitutes a connecting electrode of the adjacent memory cell.

Additionally, a method for manufacturing the semiconductor memory device according to the present invention comprises the steps of preparing a semiconductor substrate having adjacent two trenches formed for forming capacitance of two bits, forming first impurity regions each having a second impurity concentration of the same conductivity type as that of the substrate in the semiconductor substrate on the side of the sidewalls and the bottom surfaces of the adjacent trenches, forming a first conductive layer on the impurity regions and between the adjacent trenches and inside and in openings of the adjacent trenches through an insulating film, forming a second conductive layer on the planar surfaces of the first conductive layer and inside of the trenches formed of the first conductive layer, removing the first conductive layer and the second conductive layer formed above the major surface of the semiconductor substrate in a region between the adjacent trenches, forming a second impurity region having a third impurity concentration of the same conductivity type as that of the semiconductor substrate in the removed portion and in the semiconductor substrate, and forming an insulating layer on the second impurity region.

Each of the adjacent memory cells according to the present invention comprises two capacitors, the capacitance can be increased. In addition, since only the upper electrode of the capacitor on the upper side, of the two capacitors constitutes a connecting electrode between the adjacent two memory cells, the thickness of the insulating film between the two memory cells can be increased.

Furthermore, since the method for manufacturing the semiconductor memory device according to the present invention comprises the foregoing steps, it is not necessary to remove an oxide film embedded into the trenches formed of the first conductive layer before the second conductive layer is deposited on the first conductive layer.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 6C is a cross sectional view of a portion taken along a line VIC—VIC shown in FIG. 6A;

FIG. 6D is a cross sectional view of a semiconductor memory device according to an embodiment of the present invention comprising stacked trench capacitors;

DESCRIPTION OF THE PREFERRED EMBODIMENT

Description is now made on a semiconductor memory device having better isolation characteristics between the above described adjacent memory cells and a manufacturing method therefor.

In general, the thicker an intercell isolation oxide film is, the higher the intercell isolation capability is for the following reason. Assuming that a threshold voltage is represented by $V_T$, capacitance per unit area of the oxide film is represented by $C_O$ and the thickness of the oxide film is represented by $x_O$, the following relations are obtained (a and b are constants):

$$V_T = a/C_O \tag{1}$$

$$C_O = b/x_O \tag{2}$$

From the equations (1) and (2), it is found that $V_T$ is proportional to $x_O$.

(see "Physics and Technology of Semiconductor Devices", A. S. Grove John Wiley and Sons, Inc., 1967)

In order to increase isolation characteristics between memory cells, it is necessary to increase the thickness of an isolation insulating film. In order to attain this, it is necessary that the upper electrodes of the adjacent two capacitor cells comprise the upper layers and the lower layers, respectively, and only the upper layers are connected to each other. Consequently, a semiconductor memory device having better isolation characteristics between the memory cells than that of the above described semiconductor memory device is obtained.

Figure 6A:
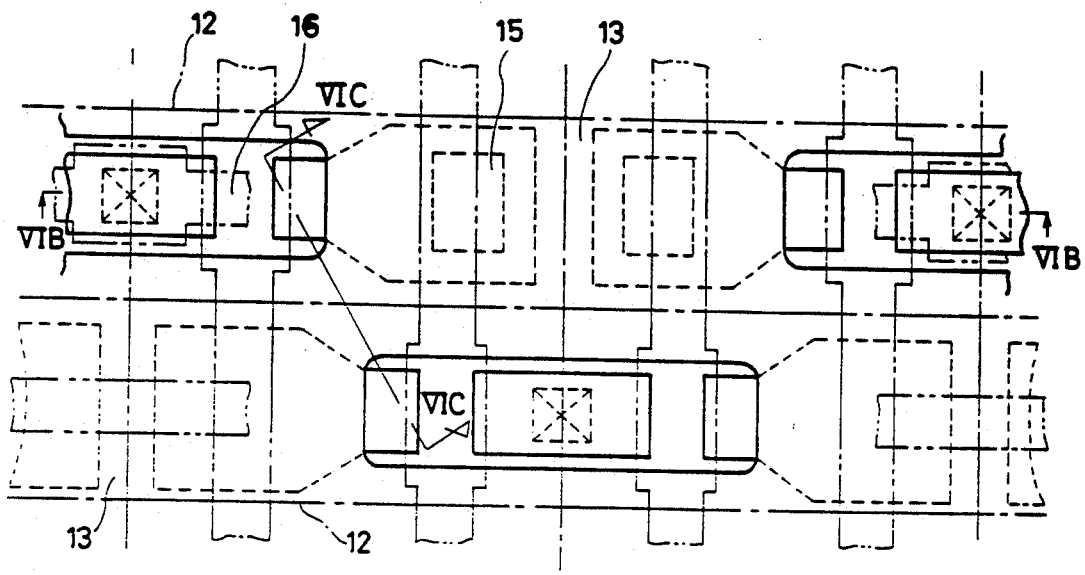
FIG. 6A is a plan view of a semiconductor memory device according to an embodiment of the present invention.
Figure 6B:
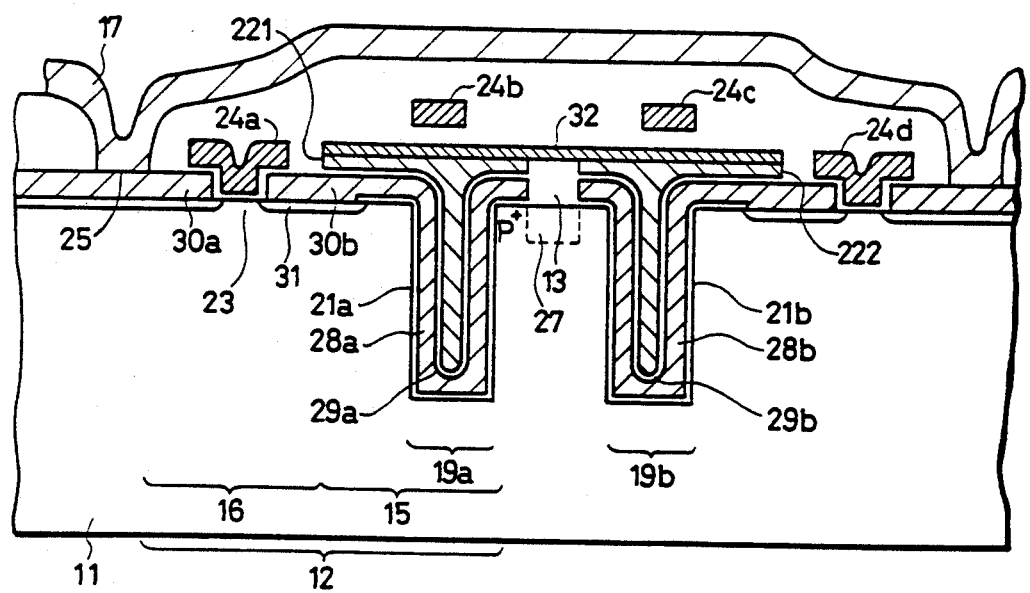
FIG. 6B is a cross sectional view of a portion taken along a line VIB—VIB shown in FIG. 6A.
Figure 7A:
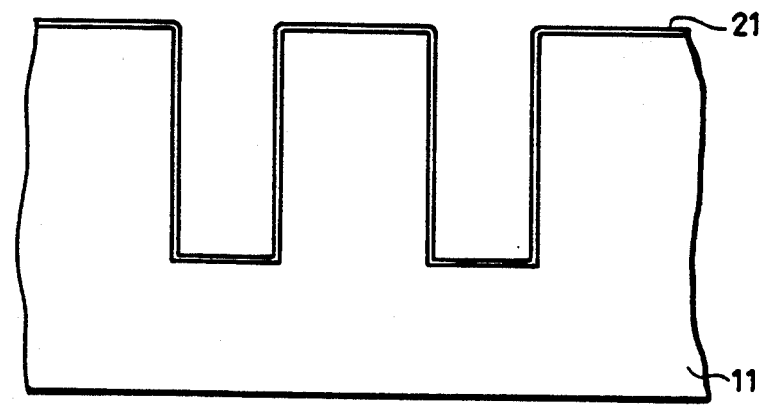
FIGS. 7A to 7E are cross sectional views for explaining process steps of the semiconductor memory device according to the present invention.
Figure 7B:
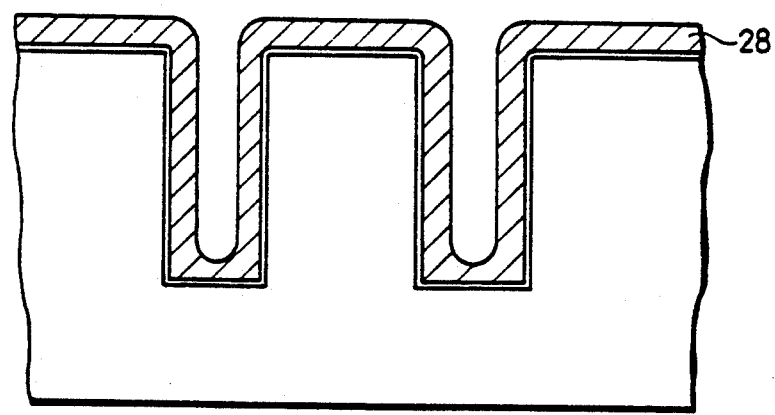
Figure 7C:
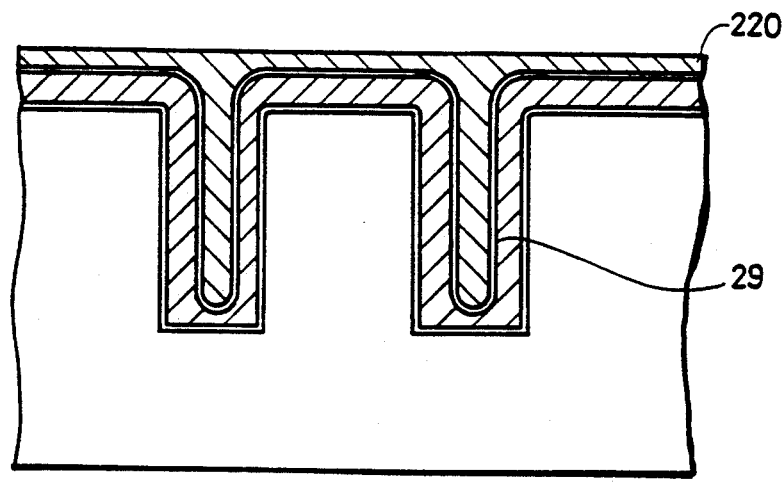
Figure 7D:
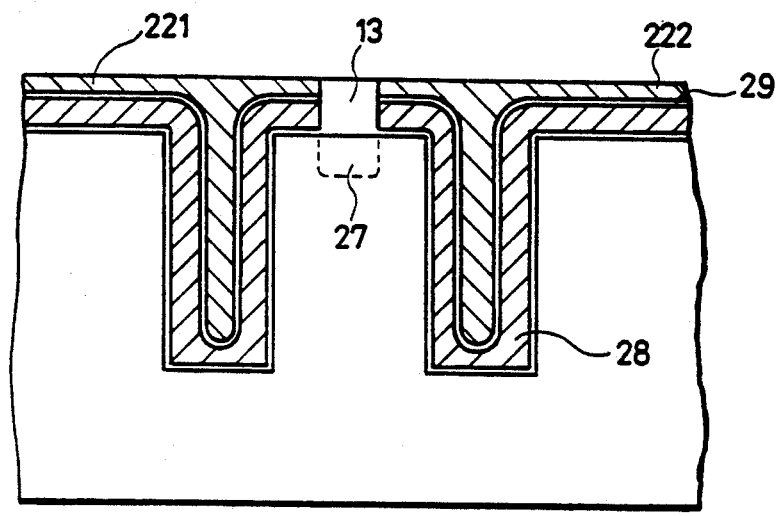
Figure 7E:
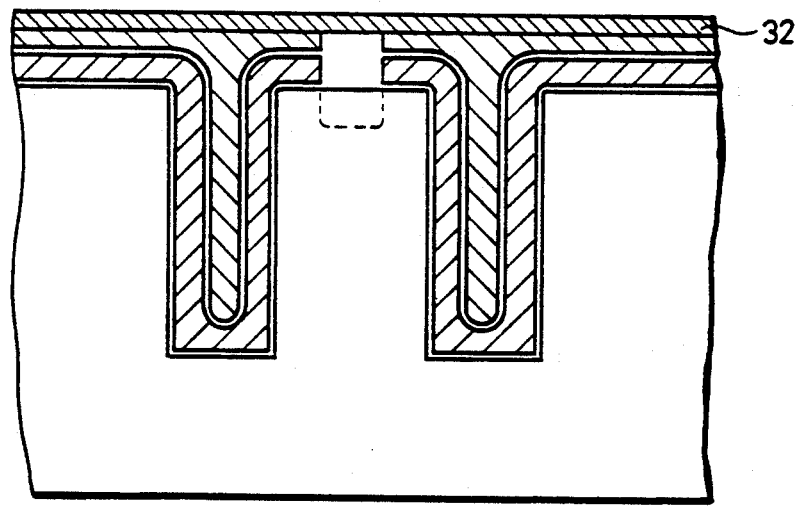

A semiconductor memory device having such improved isolation characteristics is shown in FIGS. 6A, 6B, 6C and 6D. FIGS. 6A to 6C show an improvement for improving isolation characteristics of the semiconductor memory device. FIG. 6D is a cross sectional view of a semiconductor memory device having stacked trench capacitors and an improvement of one shown in FIGS. 4A to 4C.

FIG. 6A is a plan view of an improved semiconductor memory device, FIG. 6B is a cross sectional view of a portion taken along a line VIB—VIB shown in FIG. 6A, and FIG. 6C is a cross sectional view of a portion taken along a line VIC—VIC shown in FIG. 6A.

Figure 1:
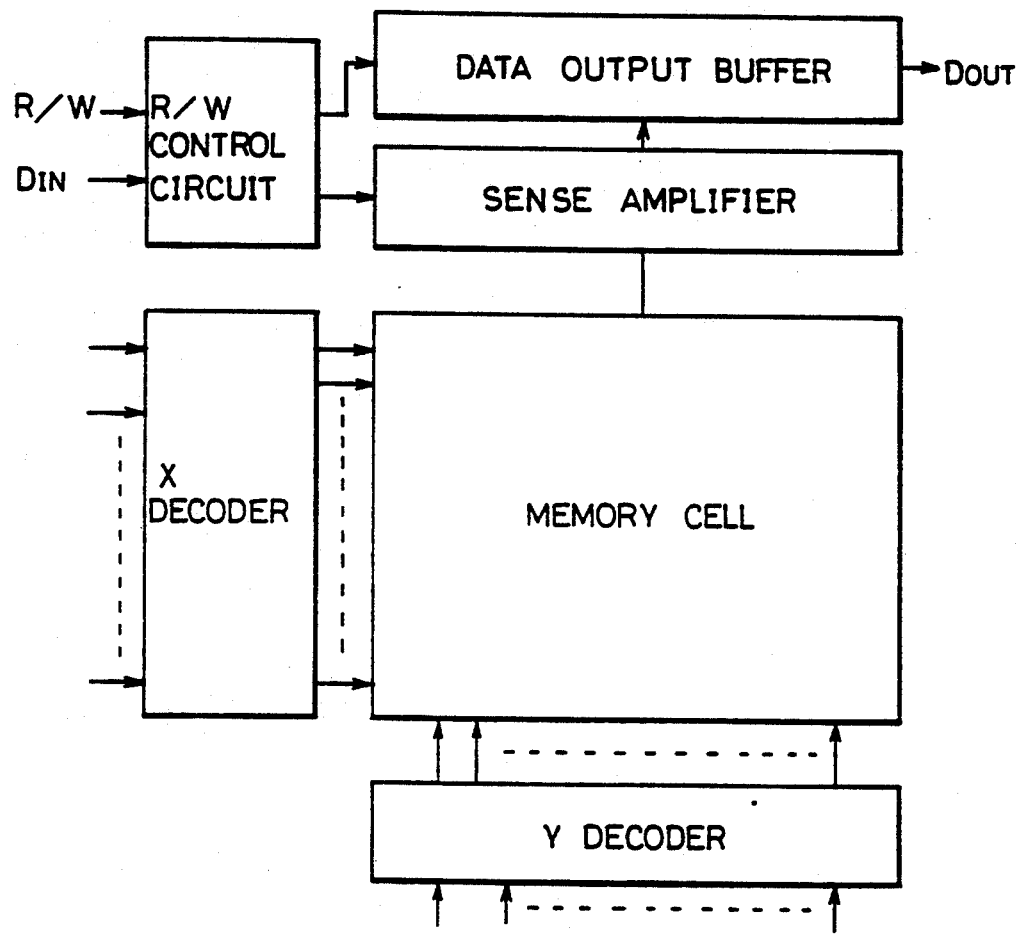
FIG. 1 is a block diagram showing structure of a general RAM.
Figure 2:
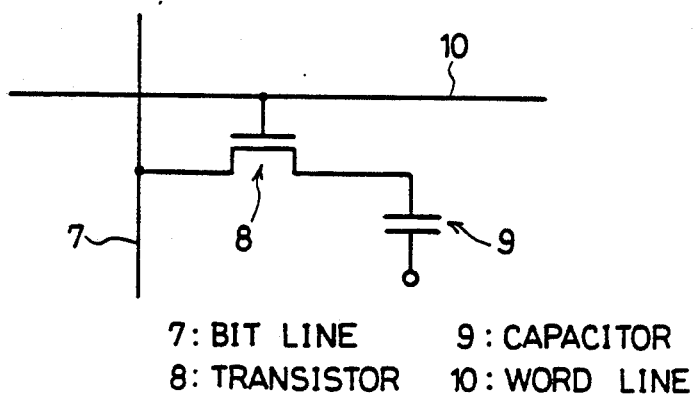
FIG. 2 is an equivalent circuit diagram of a dynamic memory cell.
Figure 3A:
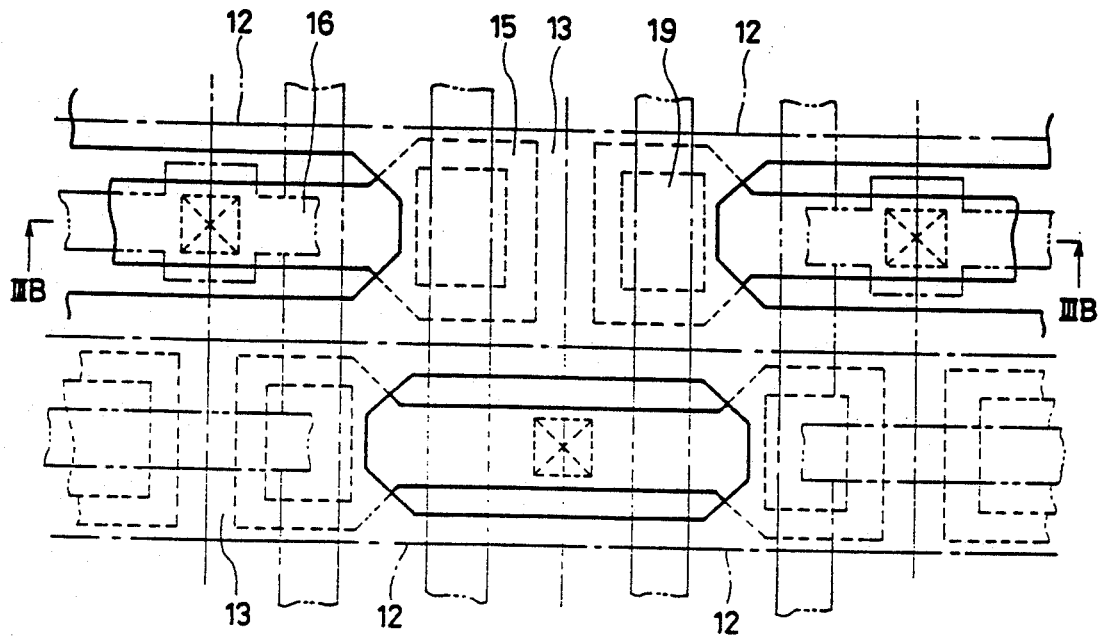
FIG. 3A is a plan view of a conventional dynamic RAM using trench memory cells.
Figure 3B:
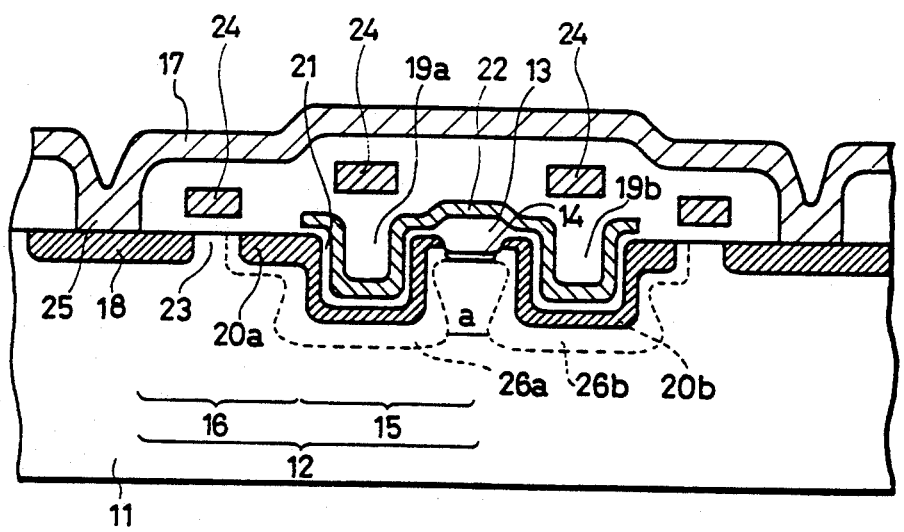
FIG. 3B is a cross sectional view of the dynamic RAM shown in FIG. 3A.
Figure 4A:
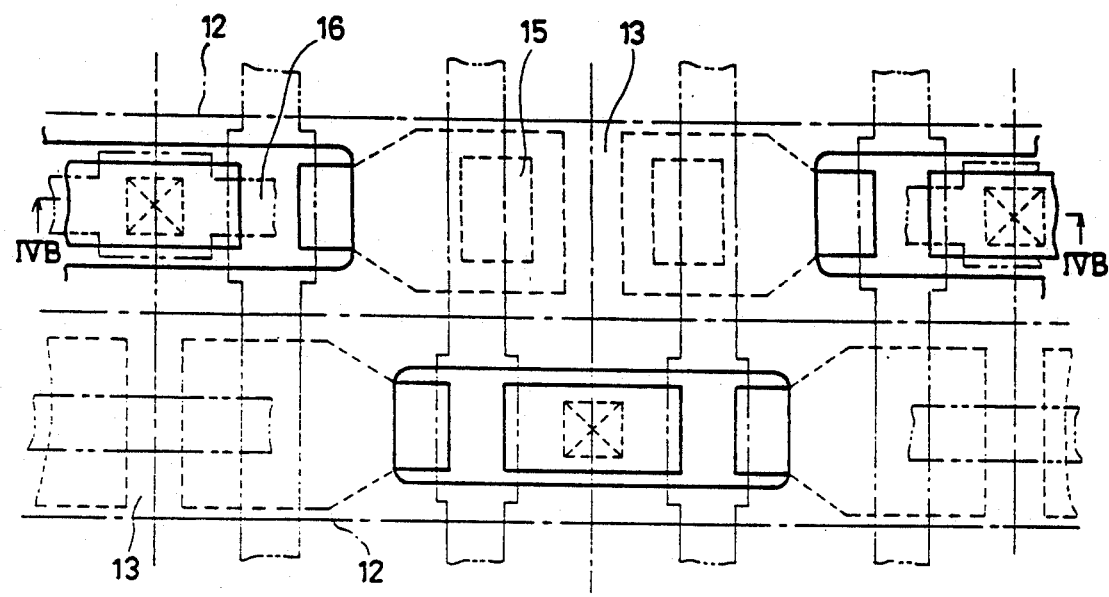
FIG. 4A is a plan view showing still another embodiment of a semiconductor memory device which provides a basis of the present invention; along a line IVB—IVB shown in FIG. 4A.
Figure 4B:
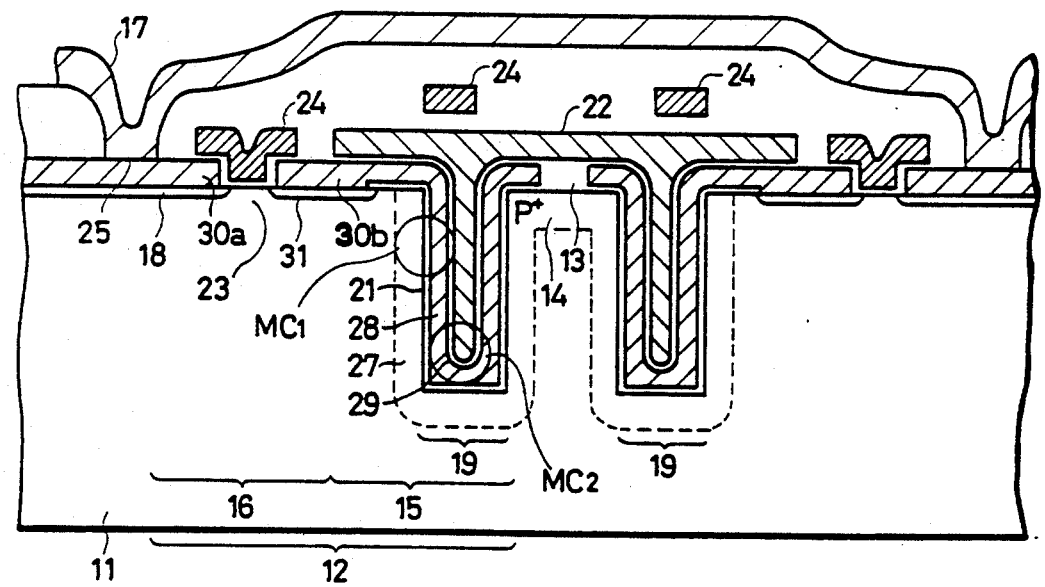
FIG. 4C is a cross sectional view of a portion taken along a line IVC—IVC shown in FIG. 4A.
Figure 5A:
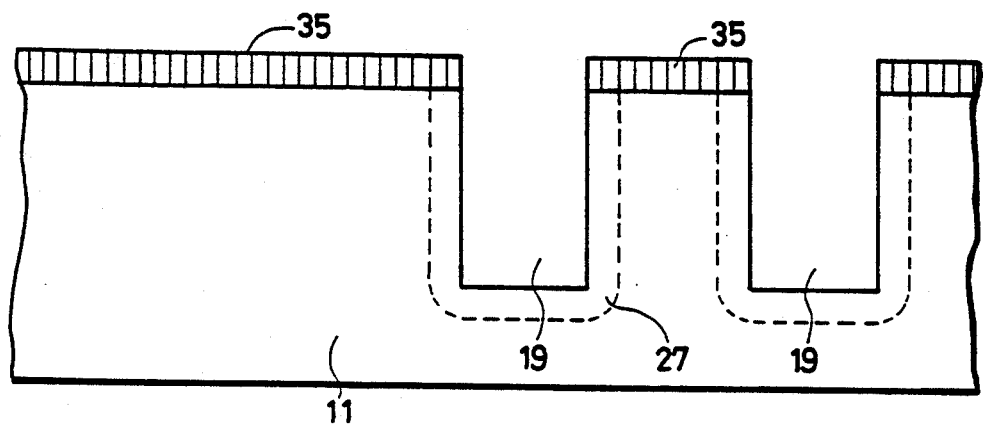
FIGS. 5A to 5H are cross sectional views for explaining process steps of a method for manufacturing a memory cell shown in FIGS. 4A and 4B.
Figure 5B:
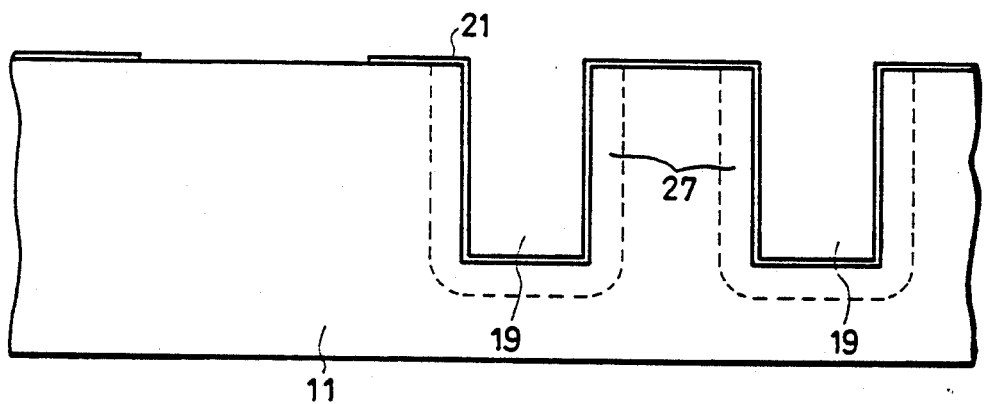
Figure 5C:
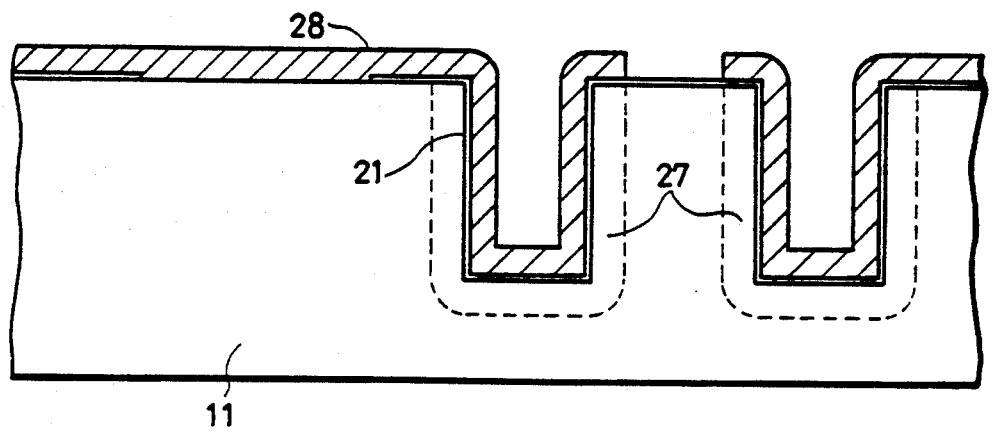
Figure 5D:
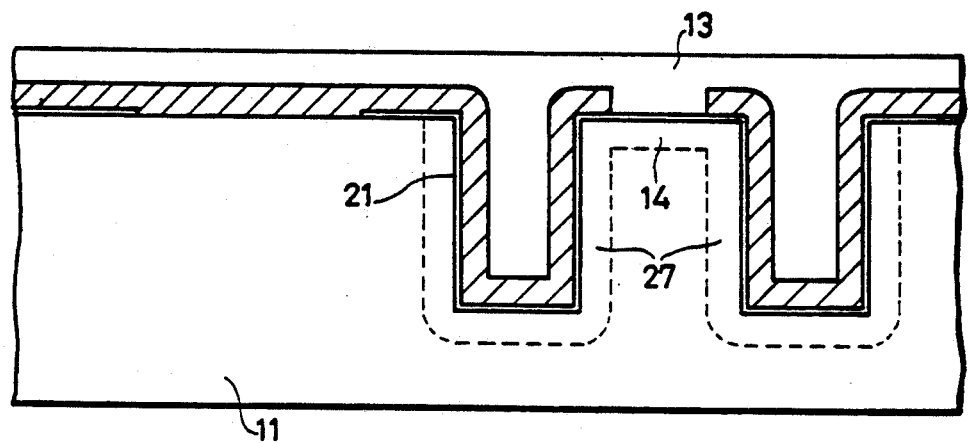
Figure 5E:
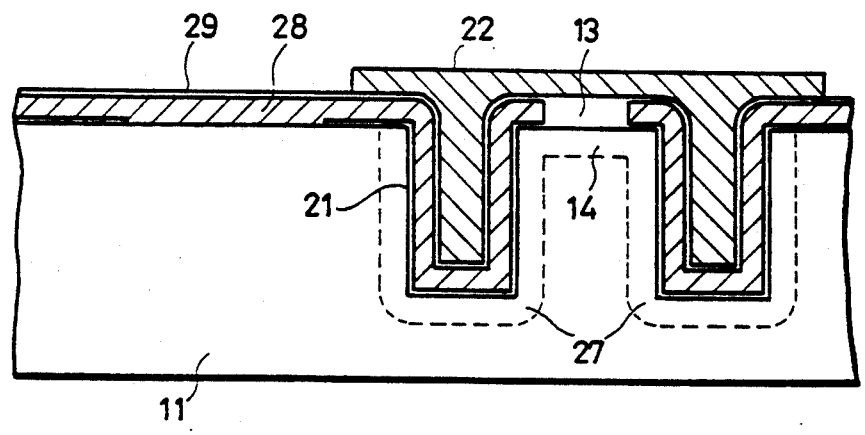
Figure 5F:
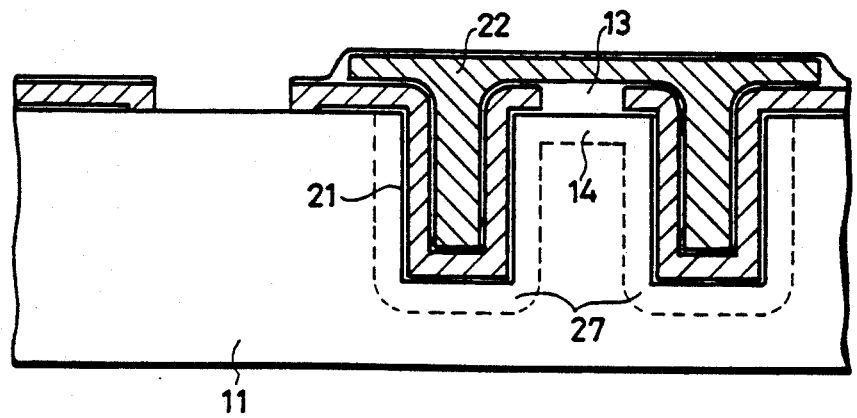
Figure 5G:
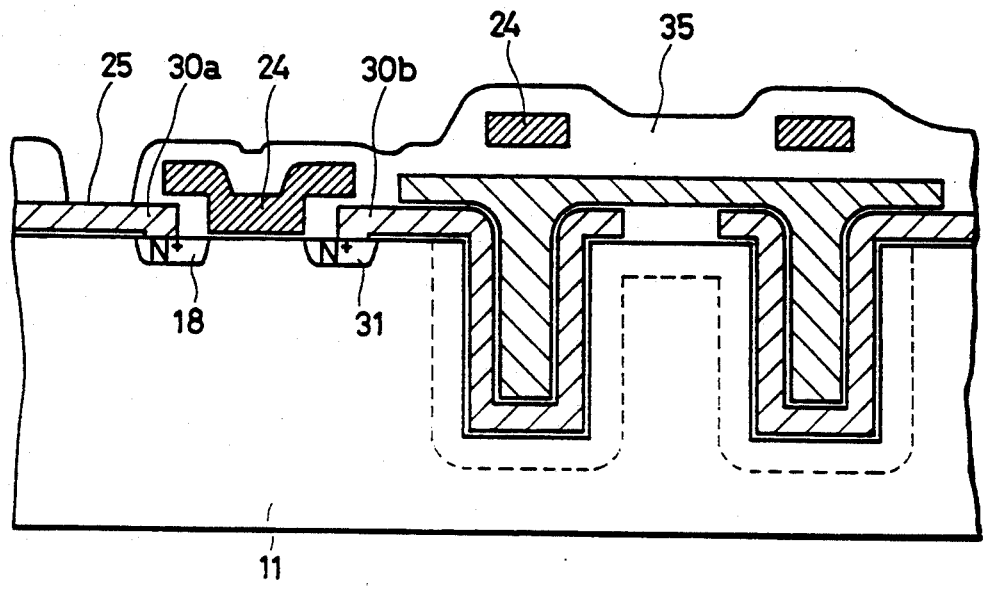
Figure 5H:
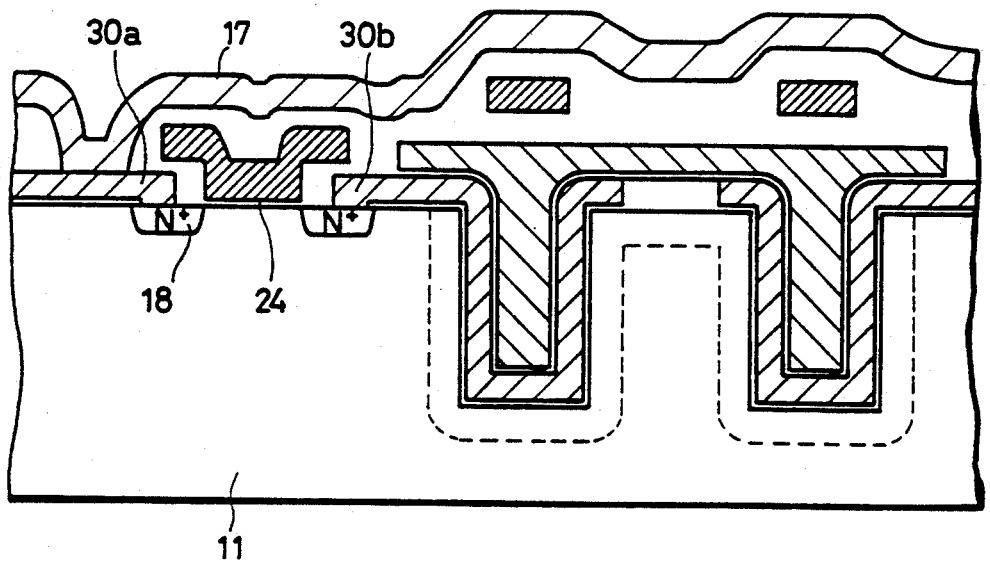

Referring to FIG. 6B, a second polysilicon electrode 22 in FIG. 4B is divided into two and it consists of an upper electrode 32 and lower electrodes 221, 222. The thickness of an isolation oxide film increases by the thickness of the lower electrodes 221, 222 compared with the case shown in FIG. 4B.

A typical intercell isolation region is shown in FIG. 6C. For comparison, a cross section of an intercell isolation region as shown in the copending application is shown in FIG. 4C. FIG. 4C is a cross sectional view of a portion taken along a line IVC-IVC shown in FIG. 4A. In FIGS. 4C and 6C, $D_1 \approx 2 \times D_2$. Referring to FIGS. 6A to 6C, the upper electrode comprises second polysilicon layers 22 and a third polysilicon layer 32. Thus, the thickness of an isolation insulating film can be increased, by the lower layer of the upper electrode. As a result, a semiconductor memory device having good isolation characteristics is obtained.

Description is now made on each step of a method for manufacturing the improved semiconductor memory device. For easy understanding of the manufacturing method, a cross section of a portion corresponding to the portion shown in FIG. 4B is illustrated. FIGS. 7A to 7E are diagrams showing the sequential steps of the method for manufacturing the improved semiconductor memory device according to the present invention.

A P type semiconductor substrate 11 having trenches of two bits is prepared. A capacitor insulating film 21 is then formed on the major surface of the semiconductor substrate by thermally oxidizing the entire substrate (in FIG. 7A). A first polysilicon layer 28 is formed on the silicon oxide film by a reduced pressure CVD process (in FIG. 7B). A second polysilicon layer 220 serving as a cell plate of the lower layer is deposited on the first polysilicon layer 28 through a capacitor insulating film 29 by the CVD process (in FIG. 7C). The first and second polysilicon layers 28 and 220 between the adjacent trenches are removed by etching using photoresist. The P+ impurity region 27 is formed in the removed portion and in the major surface of the semiconductor substrate. An insulating layer 13 serving as a field oxide film is formed on the P+ impurity region 27 and in the removed portion of the first and second polysilicon layers (in FIG. 7D). As a result, the second polysilicon layer 220 is divided into two second polysilicon layers 221, 222. A third polysilicon layer 32 serving as a cell plate of the upper layer is deposited from the top by the CVD process so that the second polysilicon layers 221, 222 and the third polysilicon layer 32 are connected to each other (in FIG. 7E). Portions other than polysilicon layers are the same as those in FIGS. 5A to 5G and hence, description thereof is omitted.

As described in the foregoing, since the method for manufacturing the semiconductor memory device having adjacent memory cells comprising two capacitors according to the present invention includes the above described steps, it is not necessary to remove a silicon oxide film in trenches in which a second polysilicon layer is formed by etching back, unlike the conventional method. Thus, a method for manufacturing a semiconductor device being easily manufactured and capable of increasing integration density is obtained.

FIG. 8A to FIG. 8E are diagrams showing the sequential steps of the method for manufacturing the improved semiconductor memory device with stacked trench capacitors.

Following to the only step that is different from ones shown in FIGS. 7A to 7E.

Figure 8A:
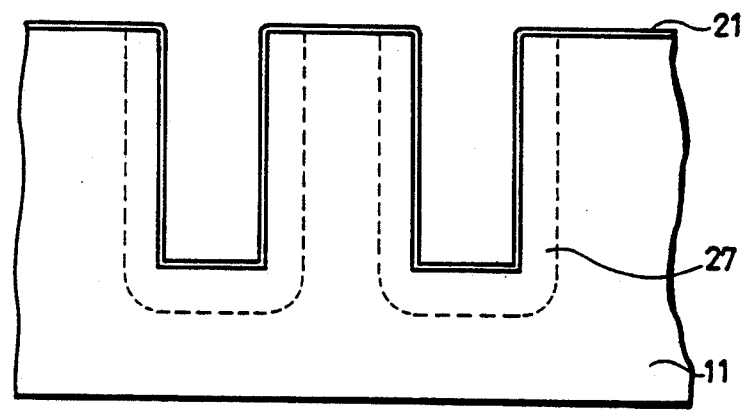
FIGS. 8A to 8E are cross sectional views for explaining process steps of the semiconductor memory device with stacked trench capacitors.
Figure 8B:
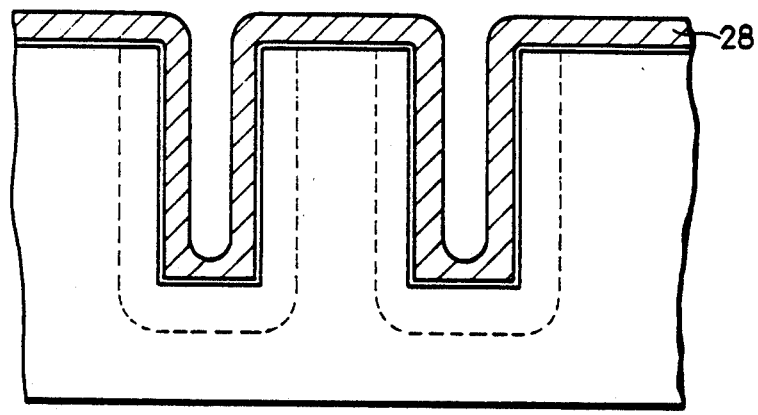
Figure 8C:
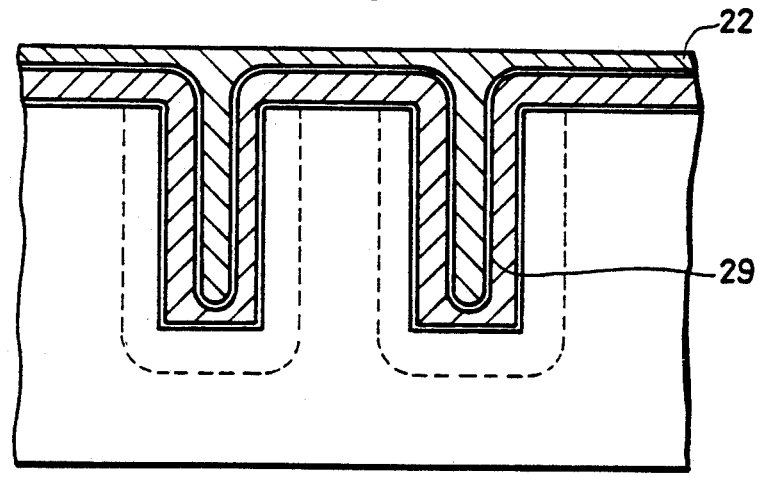
Figure 8D:
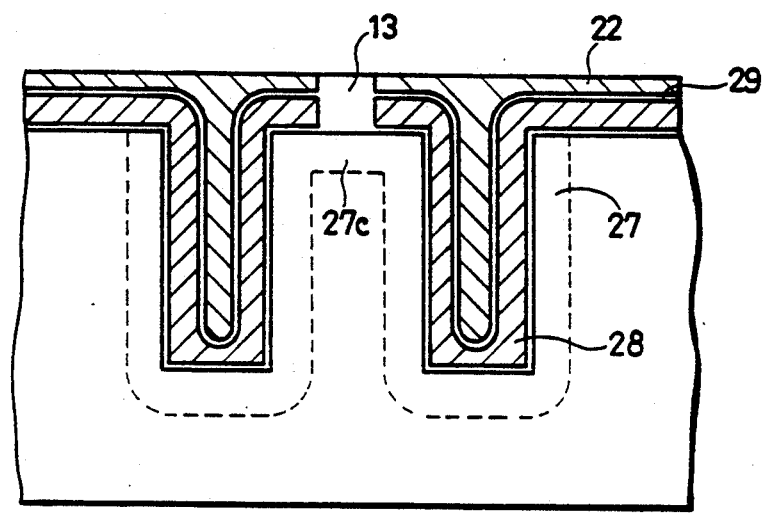
Figure 8E:
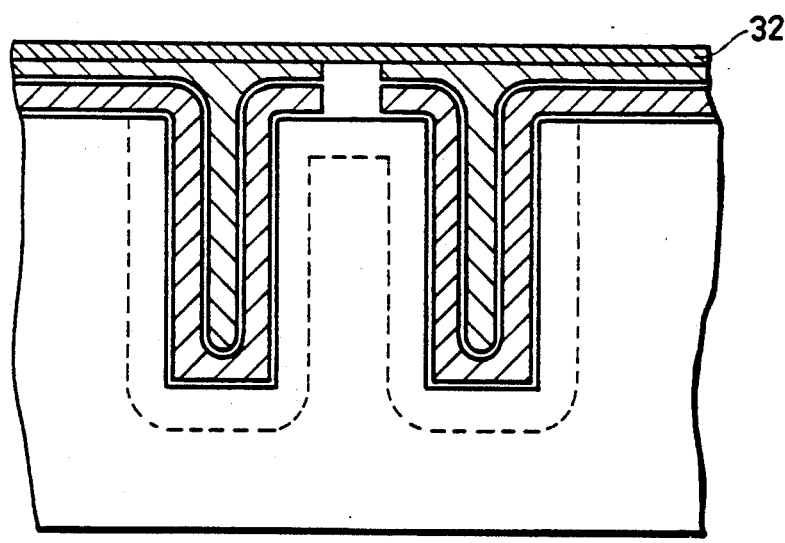

A P type semiconductor substrate 11 having trenches of two bits is prepared and P+ impurity layers 27 are formed on the sidewalls and the bottom surfaces of the trenches by diffusion or ion implantation (in FIG. 8A). Other steps corresponding to FIGS. 8B to 8E are the same as those described in explaining FIGS. 7B to 7E.

Since the method for manufacturing the semiconductor memory device with stacked trench capacitors comprises above steps, the semiconductor memory device with stacked trench capacitors of high integration density can be manufactured with ease.

As described in the foregoing, according to the present invention, since memory cells of a semiconductor memory device having adjacent two memory cells comprise opposed two capacitors, the capacitor electrode on the upper side comprises two layers and only the upper layer constitutes a connecting electrode of the adjacent memory cells, capacitance is increased and the thickness of an insulating film between the adjacent memory cells can be increased.

Additionally, the method for manufacturing the semiconductor memory device according to the present invention comprises the steps of preparing a semiconductor substrate having adjacent two trenches formed for forming capacitance of two bits, forming first impurity regions each having a second impurity concentration of the same conductivity type as that of the substrate in the semiconductor substrate on the side of the sidewalls and the bottom surfaces of the adjacent two trenches, forming a first conductive layer on the impurity regions and between the adjacent trenches and inside and in openings of the adjacent trenches through an insulating film, forming a second conductive layer on the planar surfaces of the first conductive layer and inside of the trenches formed of the first conductive layer, removing the first and second conductive layers formed above the major surface of the semiconductor substrate in a region between the adjacent trenches, forming a second impurity region having a third impurity concentration of the same conductivity type as that of the semiconductor substrate in the removed portion and in the semiconductor substrate, and forming an insulating film on the second impurity region. As a result, a semiconductor memory device having increased intercell isolation capability between the adjacent devices, capable of increasing integration density without decreasing operating characteristics and being manufactured by simple manufacturing process and a manufacturing method therefor can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor memory device, comprising the steps of:
    preparing a semiconductor substrate having a major surface, a first impurity concentration of a particular conductivity type and adjacent two trenches formed for forming capacitors to store at least two bits of information,
    forming a first conductive layer on said semiconductor substrate and inner surfaces of said adjacent two trenches through an insulating film,
    forming a second conductive layer on upper surfaces of said first conductive layer formed on the major surface of said semiconductor substrate and inside of the adjacent two trenches,
    removing a portion of said first conductive layer and said second conductive layer formed above the major surface of said semiconductor substrate and in a region between said adjacent two trenches to form adjacent first and second conductive layers,
    forming an impurity region having a second impurity concentration of said particular conductivity type in the removed said portion of the first and second conductive layers and in said semiconductor substrate, and
    forming an insulating layer on said impurity region.

2. The method according to claim 1, which further comprises the step of forming a third conductive layer on, and in contact with, the adjacent second conductive layers formed on said adjacent two trenches and on said insulating layer formed therebetween.

3. The method according to claim 2, wherein said first, second and third conductive layers comprise polysilicon layers.

4. A method for manufacturing a semiconductor memory device, comprising the steps of:
    preparing a semiconductor substrate having a major surface, a first impurity concentration of a particular conductivity type and adjacent two trenches formed for forming capacitors for storing at least two bits of information,
    forming first impurity regions each having a second impurity concentration of said particular conductivity type in said semiconductor substrate and on sidewalls and bottom surfaces of said adjacent two trenches,
    forming a first conductive layer on said first impurity regions, including the major surface of said semiconductor substrate between said adjacent two trenches, and said sidewalls and said bottom surfaces of said adjacent two trenches through an insulating film,
    forming a second conductive layer on upper surfaces of said first conductive layer formed on the major surface of said semiconductor and inside of the adjacent two trenches,
    removing a portion of said first conductive layer and said second conductive layer formed above the major surface of said semiconductor substrate and in a region between said adjacent two trenches to form adjacent first and second conductive layers,
    forming a second impurity region having a third impurity concentration of the said particular conductivity type in the removed said portion of the first and second conductive layers and in said semiconductor substrate, and
    forming an insulating layer on said second impurity region, wherein the first impurity region, said first conductive layer and the insulating film therebetween constitute a first capacitor and said first conductive layer, said second conductive layer and the insulating film therebetween constitute a second capacitor.

5. The method according to claim 4, which further comprises the step of forming a third conductive layer on, and in contact with, the adjacent second conductive layers formed on said adjacent two trenches and said insulating layer formed therebetween.

6. The method according to claim 5, wherein said first, second and third conductive layers comprise polysilicon layers.

7. A method of manufacturing a semiconductor memory device including two adjacent memory cells and a substrate of a first impurity concentration of a particular conductivity type having a substantially planar upper major surface and two adjacent trenches, each having sidewalls and bottom surfaces, for forming capacitors to store at least two bits of information, to provide enhanced isolation between the two adjacent memory cells comprising the steps of:
- forming a first impurity region in said semiconductor substrate between said two adjacent trenches, said impurity region having a second impurity concentration of said particular conductivity type;
- forming a first capacitor insulating film on the sidewalls and bottom surfaces of said two adjacent trenches;
- forming first adjacent conductive layers, each electrically insulated and spaced apart from each other, on said first capacitor insulating film in each trench and extending out from each trench over the major surface of said semiconductor substrate;
- forming a second capacitor insulating film on said first adjacent conductive layers;
- forming second adjacent conductive layers, electrically insulated and spaced apart from each other, on said second capacitor insulating film in said each trench and extending out from said each trench over the major surface of said semiconductor substrate; and
- forming a third conductive layer on said second adjacent conductive layers and overlying a region between said second adjacent conductive layers, wherein
- said first, second and third conductive layers and the second capacitor including film therebetween constitute a memory capacitor.

8. The method according to claim 7, further comprising the step of forming second impurity regions in the sidewalls and the bottom surfaces of said two adjacent trenches, wherein said second impurity regions are in contact with said first impurity region,
each second impurity region, and each of said first adjacent conductive layers and the first capacitor insulating film therebetween constitute a first capacitor,
said memory capacitor includes a second capacitor, and
said first and second capacitors of each memory cell constitute a single stacked memory capacitor.

9. The method according to claim 8, wherein said semiconductor memory device further includes an access transistor formed on a side of each stacked memory capacitor which is opposite to where the spaced apart first and second adjacent conductive layers of each said two adjacent trenches are formed, and on the major surface of said semiconductor substrate for writing and reading information to and from a respective stacked memory capacitor,
each stacked memory capacitor and each access transistor constituting a single memory cell.

10. The method according to claim 9, wherein
said access transistor includes third impurity regions of a second conductivity type formed spaced apart from each other in the major surface of said semiconductor substrate and a fourth conductive layer formed through an insulating film on a region interposed between said third impurity regions of the second conductivity type,
one of said third impurity regions of the second conductivity type being connected to a respective first conductive layer on the major surface of said semiconductor substrate,
the region interposed between said third impurity regions of the second conductivity type constituting a channel region, and
said fourth conductive layer constituting a gate electrode.

11. The method according to claim 10, wherein said adjacent memory cells have said third conductive layer in common and the semiconductor memory device further includes a plurality of memory cells arranged in rows and columns, and an intercell isolation insulating film for isolating said plurality of memory cells from each other,
said intercell isolation insulating film isolating said third impurity regions of the second conductivity type included in said adjacent memory cells,
whereby the intercell isolation insulating film formed between said adjacent memory cells has a thickness defined by the distance between said semiconductor substrate and said third conductive layer.

* * * * *